United States Patent [19]
Aoki et al.

[11] Patent Number: 5,676,781
[45] Date of Patent: Oct. 14, 1997

[54] METHOD OF PRODUCING A MULTI-LAYERED CERAMIC CIRCUIT BOARD

[75] Inventors: Shigenori Aoki; Wataru Yamagishi, both of Kawasaki, Japan

[73] Assignee: Fujitsu Limited, Kawasaki, Japan

[21] Appl. No.: 453,365

[22] Filed: May 30, 1995

Related U.S. Application Data

[62] Division of Ser. No. 94,884, Jul. 22, 1993, abandoned.

[30] Foreign Application Priority Data

Jul. 22, 1992 [JP] Japan ..................... 4-215807

[51] Int. Cl.$^6$ .................................... B32B 31/26
[52] U.S. Cl. ................. 156/89; 156/246; 156/252; 156/277; 264/61
[58] Field of Search ............... 156/247, 248, 156/252, 263, 264, 277, 89, 246; 264/61; 29/830, 851; 174/256, 258

[56] References Cited

U.S. PATENT DOCUMENTS

| | | |
|---|---|---|
| 4,867,935 | 9/1989 | Morrison, Jr. ................. 264/61 |
| 5,275,889 | 1/1994 | Yokouchi et al. . |
| 5,324,370 | 6/1994 | Aoki et al. ................. 156/89 X |
| 5,458,709 | 10/1995 | Kamezaki et al. ............. 156/89 |

FOREIGN PATENT DOCUMENTS 3-87088    4/1991    Japan .

*Primary Examiner*—David A. Simmons
*Assistant Examiner*—M. Curtis Mayes
*Attorney, Agent, or Firm*—Staas & Halsey

[57] ABSTRACT

A method of producing multi-layered ceramic circuit boards comprising laminated, component ceramic layers containing at least one hollow inorganic powder and at least one non-hollow inorganic powder. Signal transmitting conductor patterns of the boards are free from an irregular cross-sectional profile which is caused by particles of the hollow inorganic powder contained in the component ceramic layers. These multi-layered ceramic circuit boards are particularly useful for high speed transmission of digital signals of particularly high frequency.

16 Claims, 9 Drawing Sheets

50 μm

50 μm

METHOD OF PRODUCING A MULTI-LAYERED CERAMIC CIRCUIT BOARD

This application is a division of application Ser. No. 08/094,884, filed Jul. 22, 1993, now abandoned.

BACKGROUND OF THE INVENTION

1. Field of the Invention

The invention relates to multi-layered ceramic circuit boards having a reduced dielectric constant, particularly multi-layered ceramic circuit boards for mounting one or more large scale integrated circuits thereon and transmitting high speed digital signals, and more particularly multi-layered ceramic circuit boards in which the dielectric constant is contemplated being reduced by dispersing hollow inorganic spherical powder therethrough to thereby incorporate air thereinto. The invention also relates to a method of producing such multi-layered ceramic circuit boards.

2. Description of the Related Art

Conventional multi-layered ceramic circuit boards are formed by firing a stack of laminates mainly made of green sheet-like material, which is formed of a ceramic powder material or materials. In general, these multi-layered ceramic circuit boards are formed by mixing and ball-milling one or more ceramic powders, an organic binder and an organic solvent in a ball mill to thereby prepare a slurry; spreading the slurry on a plane surface of, e.g., a polymeric film by a process such as a doctor blade process; drying the spread slurry to provide a primary green sheet; cutting the primary green sheet into a plurality of green sheets having a predetermined size; forming via-holes in the green sheets for interlayer connection; printing a conductor paste on a surface of each green sheet to form circuit patterns; laminating the printed green sheets optionally in combination with unprinted green sheets to thereby form a stack; and firing the stack.

Such conventional ceramic circuit boards have high dielectric constants, suffer from large stray (parasitic) capacitances in interconnecting patterns, and thus involve a problem of preventing high speed operation of circuits. To deal with this problem, a multi-layered ceramic circuit board was proposed, in which a reduction in dielectric constant was attempted by dispersing hollow inorganic powder within the ceramic circuit board to incorporate air thereinto. For example, a hollow spherical inorganic powder-containing ceramic circuit board is described in Japanese Unexamined Patent Publication No. 59-111345 (JP 59-11345(A)), in which the ceramic circuit board comprises a matrix of dielectric ceramic material and hollow spherical inorganic powder dispersed therein.

It has been found that a green sheet containing hollow inorganic spherical powder inherently has one surface with several times greater roughness than that of the other surface, the first surface being an upper side (i.e., the side having been out of contact with a carrier film substrate for forming the green sheet) and the other surface being the lower side (i.e., the side having been in contact with the carrier film substrate) during the formation of a green sheet. This results from the fact that hollow inorganic spherical powder commonly has a smaller specific gravity than that of a solvent used to prepare a slurry for making a green sheet (while on the contrary, other ceramic materials found in ceramic circuit boards generally have larger specific gravities than that of a solvent), and the hollow spherical inorganic powder particles, which generally have greater particle diameters than other ceramic particles used in ceramic circuit boards, preferentially rise to the surface of the spread slurry before the drying of formed green sheet.

Production of known multi-layered ceramic circuit boards formed of green sheets containing hollow spherical inorganic powder is illustrated in FIGS. 1A and 1B.

First, referring to FIG. 1A, printing by a conductor paste is carried out as follows: The conductor paste is printed on the rougher surface of a green sheet 311, the rougher surface having been at the upper side during the formation of the green sheet (i.e., the surface having been out of contact with a carrier film substrate for forming the green sheet during the formation thereof, and accordingly being rougher than that of the reverse surface), to thereby form a power-supply/grounding pattern 321. Similarly, on the rougher surfaces of respective green sheets 312 and 313, the conductor paste is printed to thereby form signal transmitting patterns 332 and 333. Further, the conductor paste is printed on the rougher surfaces of respective green sheets 314 and 315 to thereby form another power-supply/grounding pattern 324 and pad patterns 345 for mounting one or more integrated circuits (Ics) and/or large scale integrated circuits (LSIs). The respective green sheets on which the patterns are thus formed are then laminated, leaving the respective rougher surfaces facing upwardly. Subsequently, the laminate is pressed, and is then fired, to thereby provide a multi-layered ceramic circuit board as shown in FIG. 1B.

The lower surface of a green sheet having been in contact with a carrier film substrate for the formation of the green sheet during the formation thereof is relatively smooth, and the reverse upper surface of the green sheet having been out of contact with the carrier film substrate has a greater roughness, as described hereinbefore. Therefore, according to the known method of production of multi-layered circuit boards as delineated above, although the formed power-supply/grounding patterns may be acceptable, it is impossible to form fine signal transmitting patterns free from an irregular cross-sectional profile resulting from the contact of the pattern surface with the hollow spherical inorganic powder particles projecting or protruding out of the surface of the green sheet and significantly pressing the pattern surface to thereby cause the deformation of the cross-sectional profile of the pattern. As is known, irregularity in the cross-sectional profile of a signal transmitting pattern in a multi-layered circuit board is responsible for disturbance of transmitted signal waveforms, particularly in the case of higher frequency signal transmission.

FIGS. 2A and 2B illustrate an alternative method of producing multi-layered ceramic circuit boards. In this alternative, printing by a conductor paste is carried out as follows: The conductor paste is printed on the smoother surface of a green sheet 411, the smoother surface having been at the lower side during the formation of the green sheet (i.e., the face having been in contact with a carrier film substrate for forming the green sheet during the formation thereof), to thereby form a power-supply/grounding pattern 421, as shown in FIG. 2A. Similarly, on the smoother surfaces of respective green sheets 412 and 413, the conductor paste is printed to thereby form signal transmitting patterns 432 and 433. Further, the conductor paste is printed on the smoother surfaces of respective green sheets 414 and 415 to thereby form another power-supply/grounding pattern 424 and pad patterns 445 for mounting one or more Ics and/or LSIs. The respective green sheets on which the patterns are formed are then laminated, leaving the respective smoother surfaces facing upwardly. Thereafter, the laminate is pressed, and is then fired, to thereby provide a multi-layered ceramic circuit board as shown in FIG. 2B.

According to this alternative method of the production of multi-layered circuit boards, it is also impossible to form fine signal transmitting patterns free from an irregular cross-sectional profile resulting from the contact of the pattern surface with the hollow powder particles projecting out of the lower surface of the green sheet during the lamination of the green sheets. Thus, the alternative is also accompanied by the problem of irregularity in the cross-sectional profile of a signal transmitting pattern, as described hereinbefore.

Japanese Unexamined Patent Publication No. 3-87088 (JP 3-87088(A)) discloses a method of forming ceramic green sheets, in which green sheets formed on carrier films are peeled from the carrier films prior to the aging of the green sheets, and the aged green sheets are recombined with the carrier films. During the recombination, the green sheets are optionally turned over to bring the surface of the green sheets having been out of contact during the formation thereof into contact with the carrier film surface. The optional turning over of the green sheets is carried out to provide a smoother surface to make the subsequent printing of conductor paste easier. In Japanese Unexamined Patent Publication No. 3-87088 (JP 3-87088(A)), signal transmission properties are not considered, and signal transmission and power-supply/grounding applications of green sheets are not differentiated from each other.

Japanese Unexamined Patent Publication No. 53-68852 (JP 53-68852(A)) teaches to increase the number of insulator layers between electrodes in a laminated ceramic capacitor. This aims to eliminate pinholes penetrating a single insulator layer interposed between the electrodes and causing a short circuit therebetween by the lamination of insulator layers.

Japanese Unexamined Patent Publication No. 53-42354 (JP 53-42354(A)) discloses a method of manufacturing laminated ceramic capacitors, in which a conductor paste is printed on the smoother surface of a ceramic green sheet having been in contact with a base carrier film substrate during the formation thereof (this surface has a higher density and therefore a smaller shrinkage during the subsequent firing), in order to prevent cracks in the ceramic insulator layer made of the green sheet from being formed around an electrode subsequently formed thereon.

SUMMARY OF THE INVENTION

It is an object of the present invention to provide multi-layered ceramic circuit boards having a reduced dielectric constant and free from irregularity in the cross-sectional profile of signal transmitting patterns causing a disturbance in signals transmitted through the patterns.

It is a further object of the invention to provide a method of producing such multi-layered ceramic circuit boards.

According to an aspect of the invention, there is provided a multi-layered ceramic circuit board having a reduced dielectric constant, which comprises laminated, component ceramic layers comprising at least one hollow inorganic powder and at least one non-hollow inorganic powder, there being at least three conductor pattern layers each being interposed between the two adjacent component ceramic layers, at least two of said layers being power-supply/grounding layers in the circuit board, and the remaining layer or layers being a signal transmitting layer or layers positioned between the power-supply/grounding layers, wherein the conductor patterns in the signal transmitting layer or layers are free from an irregular cross-sectional profile which is caused by particles of the hollow inorganic powder contained in the component ceramic layers.

According to another aspect of the invention, there is provided a method of producing a multi-layered ceramic circuit board having a reduced dielectric constant, which comprises laminated, component ceramic layers comprising at least one hollow inorganic powder and at least one non-hollow inorganic powder, there being at least three conductor pattern layers each being interposed between the two adjacent component ceramic layers, at least two of said layers being power-supply/grounding layers in the circuit board, and the remaining layer or layers being a signal transmitting layer or layers positioned between the power-supply/grounding layers, the method comprising:

mixing at least one hollow inorganic powder, at least one non-hollow inorganic powder, an organic binder and a solvent to thereby prepare a slurry;

spreading the slurry on a plane substrate;

drying the spread slurry to form a primary green sheet;

making a plurality of green sheets having a predetermined size from the primary green sheet;

forming via-holes in the individual green sheets for inter-layer connection;

printing a conductor paste on a surface of each green sheet having a predetermined size to thereby form predetermined conductor patterns;

laminating the printed green sheets, and placing a further green sheet having no printed conductor pattern on the uppermost printed green sheet, to thereby form a stack of the green sheets; and firing the stack;

wherein the stack of the green sheets is formed in such a manner that the conductor patterns for signal transmission are in contact only with the smoother surface of each green sheet containing the hollow powder, the smoother surface having been in contact with a surface of the substrate during the formation of the primary green sheet from which the green sheets for the stack are made.

The present invention effectively eliminates the problem of irregularity in the cross-sectional profile of signal transmitting patterns in prior multi-layered ceramic circuit boards.

DESCRIPTION OF THE PREFERRED EMBODIMENTS

Figure 1A:
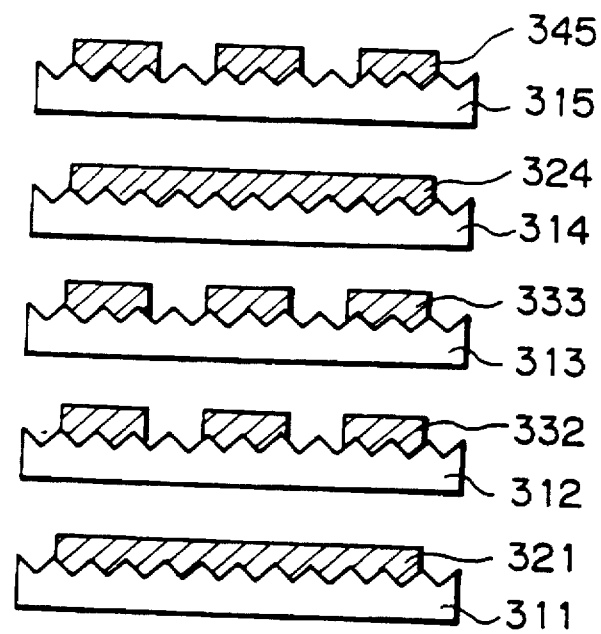
FIGS. 1A and 1B schematically show production of prior multi-layered ceramic circuit boards.
Figure 1B:
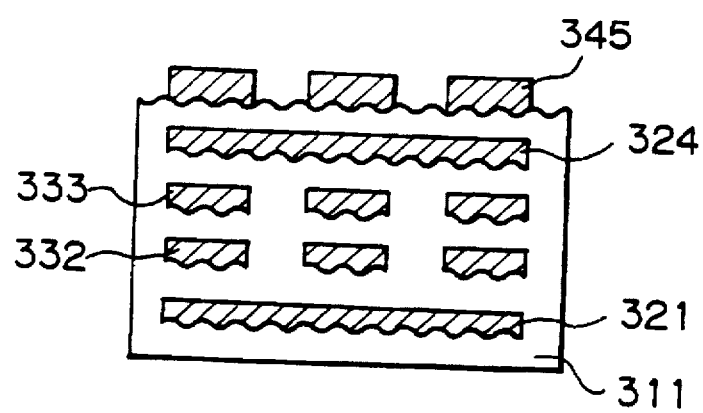
Figure 2A:
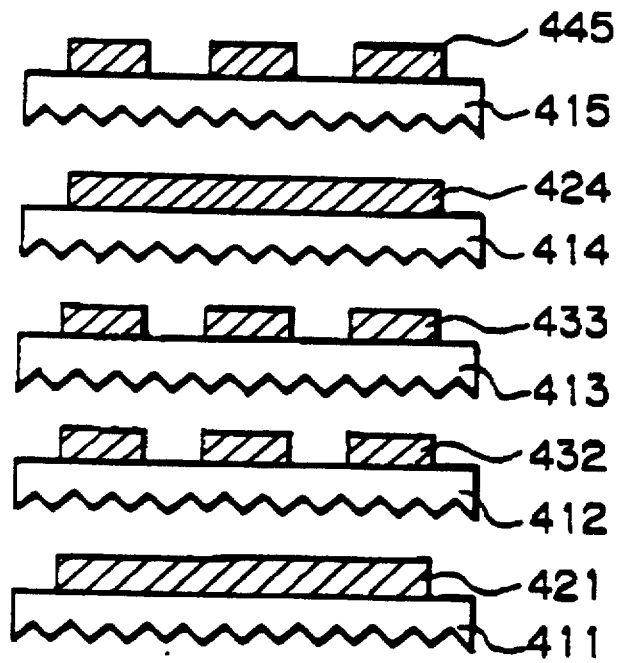
FIGS. 2A and 2B illustrate alternative production of prior multi-layered ceramic circuit boards.
Figure 2B:
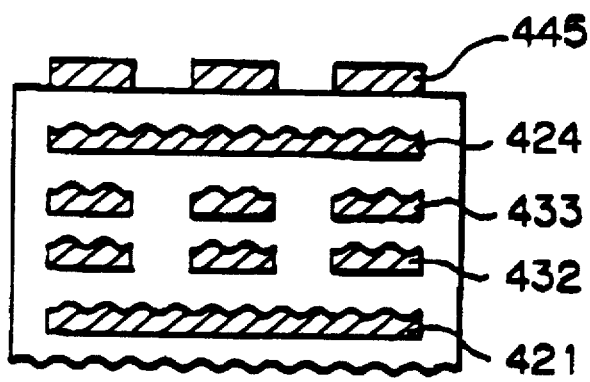
Figure 3A:
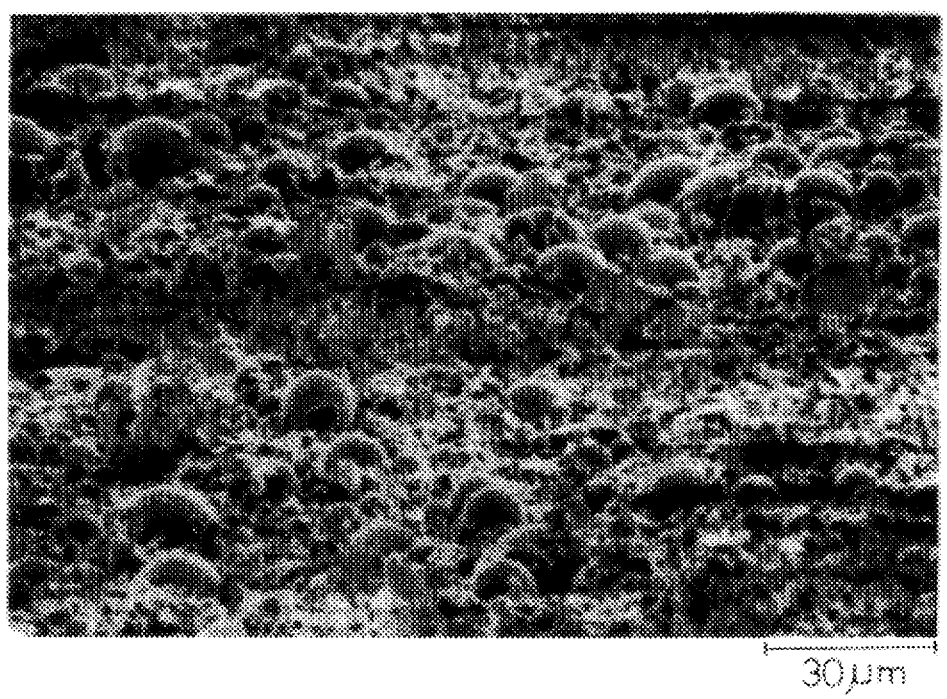
FIGS. 3A and 3B are scanning electron photomicrographs of surfaces of a ceramic green sheet containing hollow inorganic powder.
Figure 3B:
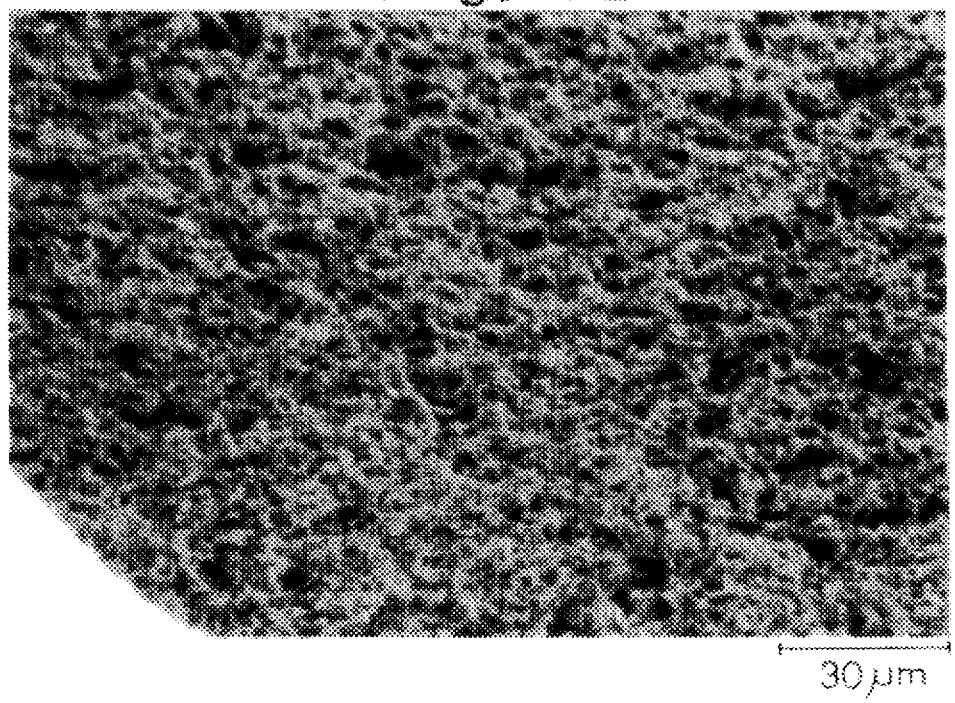

FIGS. 3A and 3B are scanning electron micrographs of a hollow inorganic powder-containing green sheet. FIG. 3A shows the surface of the green sheet which was at the upper side (the side out of contact with a carrier film substrate) during the formation of the green sheet, viewing at an angle of 45°. On this surface, hollow powder particles are observed which project from the green sheet surface and make the surface rougher. FIG. 3B shows the green sheet surface which was at the lower side (the side in contact with the substrate) during the formation of the green sheet. No hollow powder particles are found on this surface, and the surface is much smoother than the hollow powder particle-projecting surface in FIG. 3A.

Figure 4A:
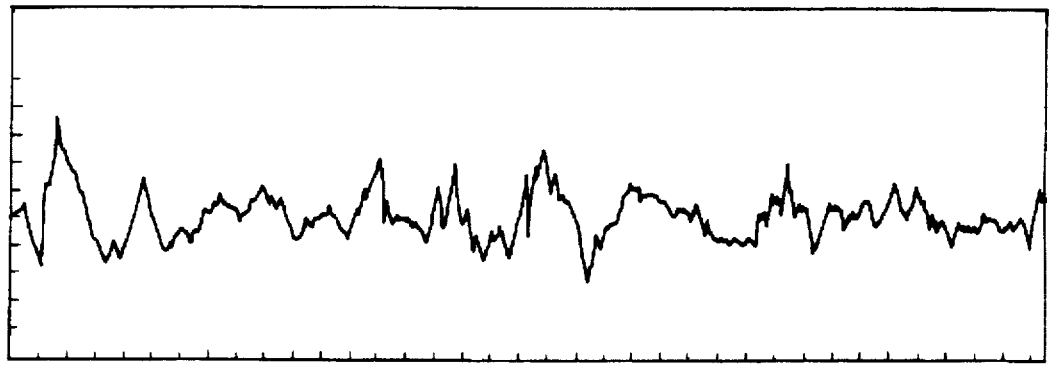
FIGS. 4A and 4B diagrammatically show surface roughness data of the rougher surface and the smoother surface, respectively, of a fired ceramic sheet obtained by firing a green sheet containing hollow inorganic powder.
Figure 4A:
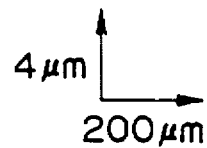
Figure 4B:
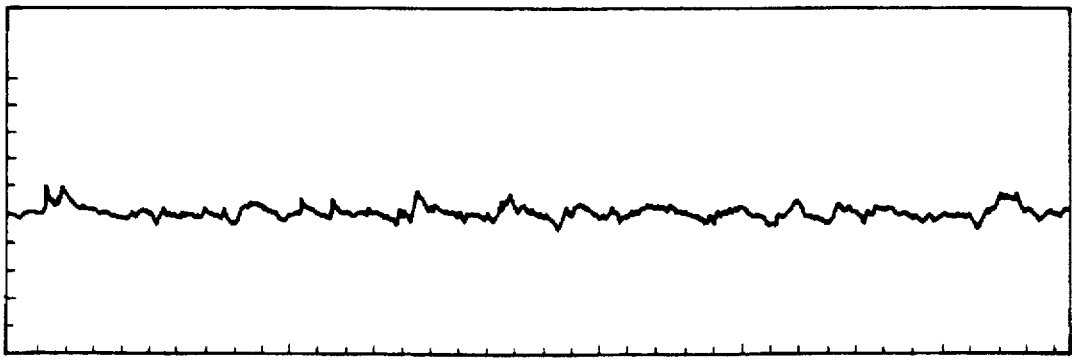
Figure 4B:
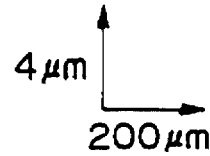

FIGS. 4A and 4B diagrammatically show surface roughness data of the rougher surface and the smoother surface, respectively, of a fired ceramic sheet obtained by firing a green sheet containing hollow inorganic powder. From these data, it can be seen that the rougher surface has an average surface roughness $R_a$ of 0.8 micrometers, whereas the smoother surface has an average surface roughness $R_a$ of 0.2 micrometers. The difference in surface roughness between rougher and smoother surfaces is thus significantly large. This significantly large difference in surface roughness results from the presence or absence of hollow particles on the surface of green sheet. By way of example, hollow silica powder has an average particle diameter of about 10 to 20 micrometers, whereas non-hollow ceramic particles commonly used in ceramic circuit boards have an average particle diameter of about 3 to 5 micrometers.

In the multi-layered ceramic circuit boards according to the present invention, each signal transmitting pattern is in contact only with the smoother surfaces of the green sheets, from which hollow inorganic powder particles having a relatively large average diameter compared to that of non-hollow powder particles do not project or protrude. Unlike prior multi-layered circuit boards made of hollow powder-containing green sheets, in which one of the surfaces of each signal transmitting pattern is in contact with the rougher surface of the green sheet, the signal transmitting patterns in the inventive ceramic circuit boards are free from an irregular cross-sectional profile which is caused by the contact of the conductor pattern surface with the hollow inorganic powder particles projecting from the green sheet surface, and possibly in part caused by a particle or particles of hollow powder present near the green sheet surface in contact with the conductor patterns, which will cause a disturbance in the transmitted signal waveforms, particularly in the case of higher frequency transmitted signals.

These multi-layered ceramic circuit boards are produced by the method of the present invention, in which a stack of green sheets for the fabrication of a circuit board is formed in such a manner that conductor patterns for signal transmission are in contact only with the smoother surface of each green sheet containing the hollow powder, the smoother surface having been in contact with a surface of a substrate during the formation of a primary green sheet from which the green sheets for the stack are made.

In an embodiment of the present invention, the stack of green sheets may be made by forming power-supply/grounding patterns on the rougher surfaces of respective green sheets from which hollow powder particles project, forming signal transmitting patterns on the smoother surface of respective green sheets in which surface no hollow powder particles are present, and laminating the green sheets in such a manner that each green sheet bearing the signal transmitting conductor patterns is interposed between the green sheets bearing the power-supply/grounding patterns.

In general, multi-layered ceramic circuit boards for high speed digital signal transmission comprise two types of conductor layers; one type is conductor layers of signal transmitting patterns, and the other type is layers of power-supply/grounding patterns (shield layers), the number of conductor layers classified into one type being nearly the same as the number of conductor layers classified into the other type. Since conductor patterns for signal transmission are strongly required to exclude irregularities in cross-sectional profile, it is essential in the present invention that the signal transmitting conductor patterns be sandwiched between the smoother surfaces of the green sheets. According to the above-described embodiment, the signal transmitting conductor patterns formed on each green sheet are ensured to be in contact with the smoother surface of another green sheet bearing the power-supply/grounding patterns.

Figure 5A:
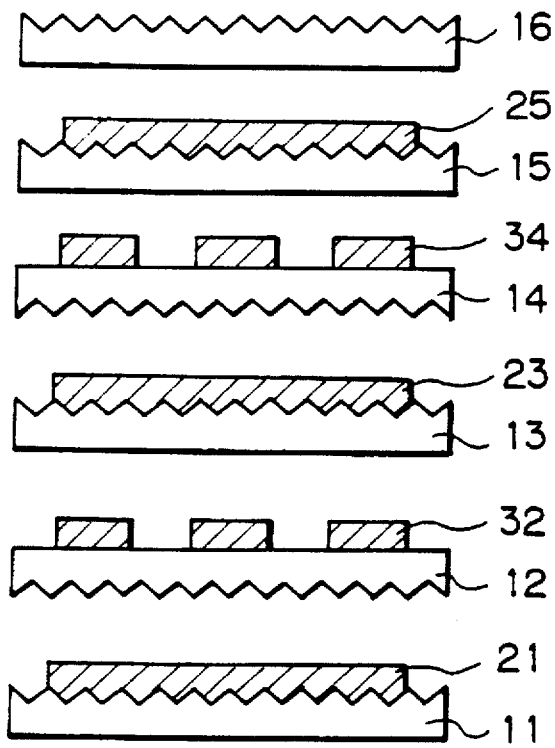
FIGS. 5A and 5B schematically show an embodiment of the invention.
Figure 5B:
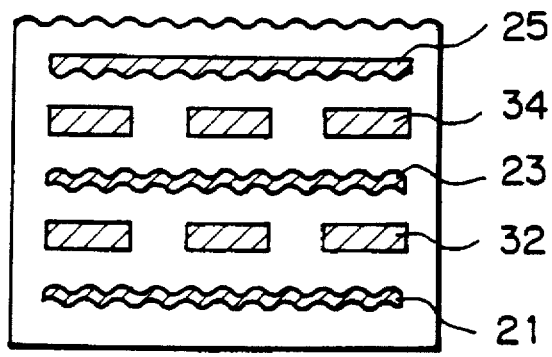

FIGS. 5A and 5B illustrate this embodiment. As shown in FIG. 5A, a conductor paste is printed on the rougher surfaces of respective green sheets 11, 13 and 15 containing hollow powder particles, to thereby form respective power-supply/grounding patterns 21, 23 and 25. Similarly, the conductor paste is printed on the smoother surfaces of respective hollow particle-containing green sheets 12 and 14, to thereby form respective signal transmitting patterns 32 and 34. These green sheets bearing respective conductor patterns are then laminated in sequence as indicated in FIG. 5A, and further, a green sheet 16 bearing no conductor pattern is placed on the uppermost green sheet 15 bearing the conductor pattern, to form a stack of green sheets. The stack is subsequently pressed and fired to provide a multi-layered ceramic circuit board, as shown in FIG. 5B. In FIG. 5A, the green sheet 16 with no conductor pattern is placed on the underlying green sheet 15 in such a manner that the smoother surface thereof comes into contact with the conductor pattern (power-supply/grounding pattern) on the green sheet 15 bearing the conductor pattern. However, the rougher surface of the green sheet 16 may be in contact with the power-supply/grounding pattern formed on the underlying green sheet 15, in this embodiment of the invention.

It should be noted herein that, in the attached drawings illustrating the various embodiments of the present invention, via-holes for interconnection formed in green sheets are not shown, for simplification.

The stack may also be made by forming all of the conductor patterns on a-multi-layered ceramic circuit board on the smoother surfaces of respective green sheets, and laminating the green sheets in sequence, while inserting an additional, hollow inorganic powder-containing green sheet between the sequentially laminated green sheets in such a manner that the smoother surface of the additional green sheet comes into contact with the signal transmitting patterns on the laminated green sheet. In this embodiment, the inserted, additional green sheets are provided with via-holes adapting to the corresponding via-holes in the green sheet bearing the signal transmitting patterns with which the additional green sheet comes into contact.

Figure 6A:
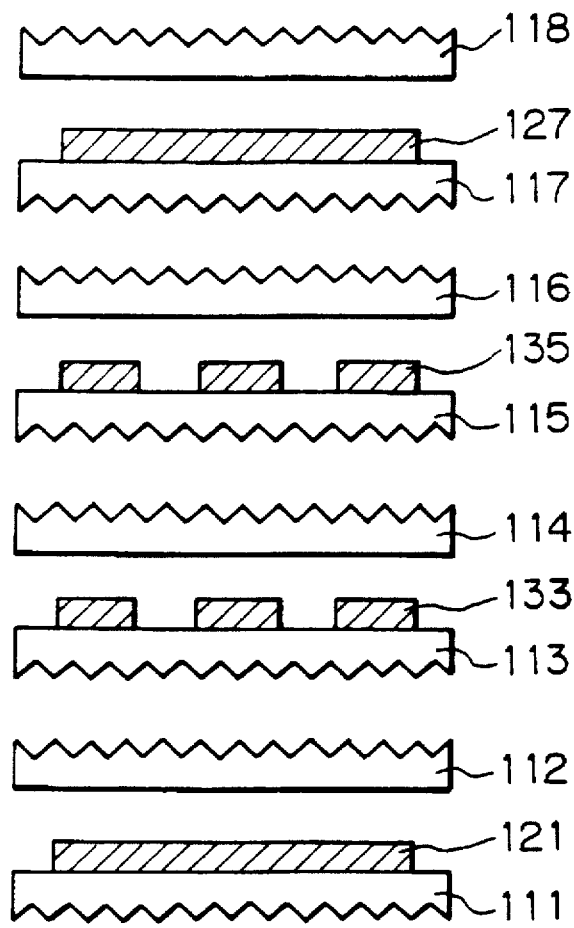
FIGS. 6A and 6B schematically show another embodiment of the invention.
Figure 6B:
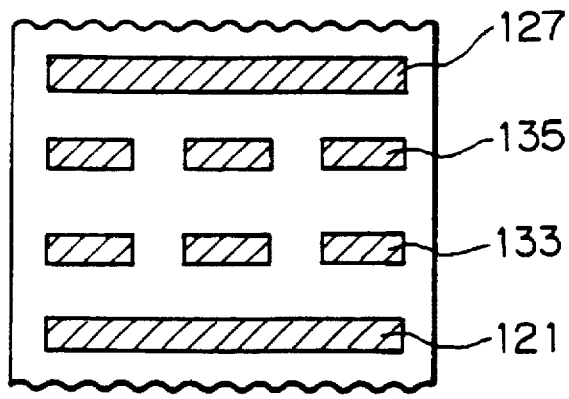

This embodiment is illustrated in FIGS. 6A and 6B. As shown in FIG. 6A, both power-supply/grounding patterns 121, 127, and signal transmitting patterns 133, 135 are formed on the smoother surfaces of respective green sheets 111, 113, 115 and 117 containing hollow powder particles. Further, additional green sheets 112, 114 and 116 are provided, which bear no conductor pattern thereon, and in which via-holes corresponding to the via-holes in the respective, counter green sheets 113, 115 and 117 are formed. These green sheets are then laminated in sequence as indicated in FIG. 6A, and further, a green sheet 118 bearing no conductor pattern is placed on the uppermost green sheet 117 bearing the conductor pattern 127 in such a manner that the smoother surface thereof comes into contact with the conductor pattern 127 formed on the underlying green sheet 117, to thereby make a stack of green sheets. During this process, the additional green sheets 112, 114 and 116 are inserted in such a manner that the smoother surface of each additional green sheet comes into contact with the signal transmitting patterns on the opposing green sheet. The stack is then pressed and fired to provide a multi-layered ceramic circuit board of the invention, as shown in FIG. 6B. According to this embodiment, the signal transmitting patterns as well as the power-supply/grounding patterns sandwiched by hollow powder-containing green sheets are free from contact with coarse particles projecting out of the surfaces of the green sheets.

It should be noted that although the signal transmitting patterns 133 and 135 are depicted in FIGS. 6A and 6B as if both patterns extend in the same direction (perpendicularly to the sheet), the patterns in different layers located between two layers of power-supply/grounding patterns in practice extend in different directions. (In general, such signal transmitting patterns in different layers extend perpendicularly in a multi-layered circuit board.) The same is true of the other similar drawings attached to this specification.

Alternatively, the stack may be made by using previously coupled green sheets having smoother surfaces on both sides as the green sheets to come into contact with signal transmitting patterns, in place of the insertion of additional green sheets during the fabrication of the stack in the foregoing embodiment. The coupled green sheets may be readily obtained by coupling two green sheets in such a manner that the rougher surfaces of the individual green sheets are in contact with each other.

Figure 7A:
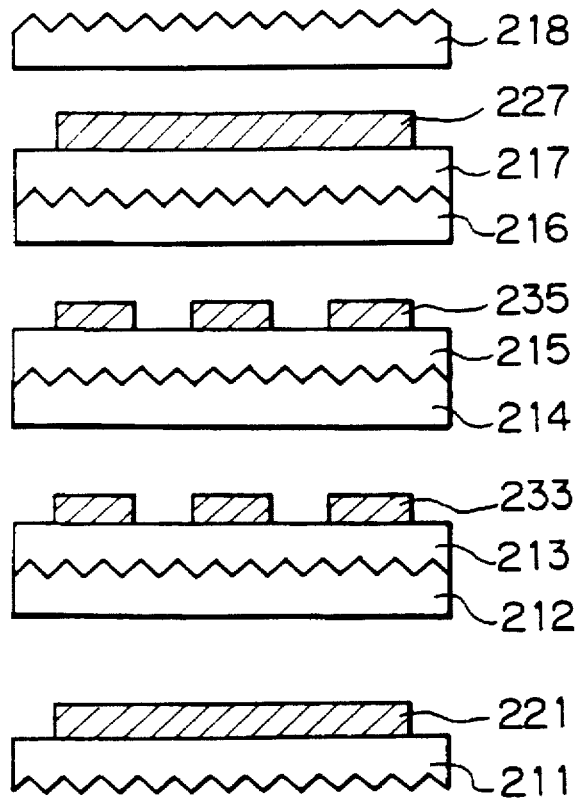
FIGS. 7A and 7B schematically show a further embodiment of the invention.
Figure 7B:
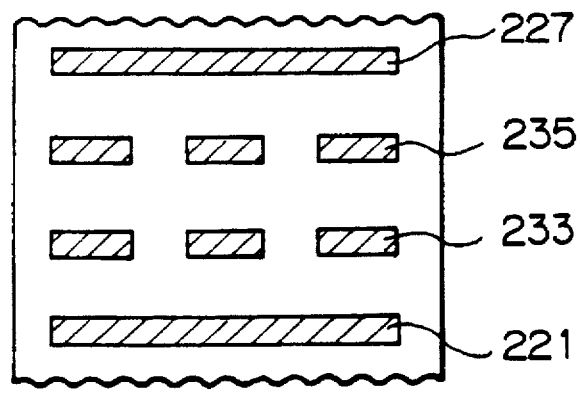

This alternative embodiment of the invention is illustrated referring to FIGS. 7A and 7B. Power-supply/grounding pattern 221 is formed on the smoother surface of a hollow powder particle-containing green sheet 211, which is contemplated for use as the bottom green sheet in a multi-layered circuit board design. Other conductor patterns 233, 235 and 227 (the previous two are signal transmitting patterns, and the latter is another power-supply/grounding pattern) are formed on the surfaces of coupled green sheets 212+213, 214+215 and 216+217. These coupled green sheets are previously fabricated by combining two green sheets together in such a manner that the rougher surfaces of individual green sheets are in contact with each other, and pressing and bonding the combined green sheets to each other, to thereby produce an integrated green sheet having smoother surfaces free from projecting hollow particles on both sides thereof. A stack of green sheets is then made by laminating the green sheet 211 bearing the power-supply/grounding pattern 221, and the coupled green sheets 212+213, 214+215 and 216+217, bearing respective patterns 233, 235 and 227, in sequence as indicated in FIG. 7A. Further, a green sheet 218 bearing no conductor pattern is placed on the uppermost green sheet 217 bearing the conductor pattern 227 in such a manner that the smoother surface thereof comes into contact with the conductor pattern 227 formed on the underlying coupled green sheet 216+217. The stack is subsequently pressed and fired to provide a multi-layered ceramic circuit board of the invention, as shown in FIG. 7B. According to this embodiment, both the signal transmitting patterns and the power-supply/grounding patterns sandwiched by hollow powder-containing green sheets are free from contact with coarse hollow powder particles projecting out of the surfaces of the green sheets, as in the embodiment illustrated in FIGS. 7A and 7B.

The multi-layered ceramic circuit boards of the invention can additionally be provided with one or more further ceramic layers containing no hollow powder to cover one or both of the surfaces thereof. Such circuit boards covered with the further ceramic layer(s) containing no hollow particle are particularly useful for forming thin film patterns for interconnection, such as those formed using a sputtering or evaporation process, on a surface of the circuit board. For deposition of such a thin film, a circuit board surface is previously ground so as to become more even. Circuit boards produced using only green sheets containing hollow inorganic powder possibly provide new surfaces, which are too rough to form thin film patterns thereon, due to the exposure of buried hollow particles by grinding, even if no projecting hollow particles are found on the initial surfaces of the circuit boards. The surface layers containing no hollow particles can advantageously provide ground surfaces which are sufficiently even for the formation of thin film patterns.

In addition, the multi-layered ceramic circuit boards of the invention may be provided with pads on a surface thereof, to be used for mounting one or more components such as Ics and/or LSIs. Furthermore, the circuit boards of the invention may have pins on another surface thereof, which are used for connection with external circuits.

In the present invention, materials which may be used as hollow inorganic powders include powders of hollow silica and hollow alumina. The non-hollow inorganic powders used in the invention may be any non-hollow inorganic powders commonly used in various multi-layered ceramic circuit boards, which are exemplified by powders of silicate glass, borosilicate glass, quartz glass, and alumina. A person with ordinary skill in the art would appreciate that hollow and non-hollow powders used in the present invention are not limited to those specifically enumerated above.

A person with ordinary skill in the art reading the description presented herein would fully understand and appreciate the present invention. However, for more complete understanding, the following example is provided. It should be noted that the example is only illustrative of the invention, and is not to be construed as limiting the spirit and scope of the present invention.

EXAMPLE

A slurry was prepared by mixing 20 grams of powder of hollow silica having a specific gravity of 0.5 and an average particle diameter of 20 micrometers, 200 grams of powder of borosilicate glass having a specific gravity of 2.5 and an average particle diameter of 5 micrometers, 200 grams of ethanol, 10 grams of polyvinyl butyral resin, and 10 grams of dibutyl phthalate. The resultant slurry was then spread on a film of Mylar by a doctor blade process, and was air-dried, to thereby provide a green sheet 200±50 micrometers thick. Mylar is a registered trademark of E. I. Du Pont de Nemours. The dried green sheet was then cut into 100×100 millimeter green sheets. Subsequently, these green sheets were peeled from the Mylar sheets. A copper paste was then screen-printed on a surface of each green sheet so as to provide conductor patterns having a thickness of 30 micrometers. The copper paste was printed either on the smoother surface (which was in contact with the surface of the Mylar sheet during the formation of green sheet) or the rougher surface (which was not in contact with the Mylar sheet surface) of each green sheet. (It is noted that, in this example, no via-holes were formed in the green sheets for simplification.)

Three green sheets bearing conductor patterns on the smoother surface and three green sheets bearing conductor patterns on the rougher surface were piled up in sequence, and a green sheet having no conductor pattern was then placed on the top of the piled-up green sheets, to thereby provide a stack of green sheets. Similarly, a stack of green sheets was made, in which three green sheets bearing conductor patterns on the rougher surface and three green sheets bearing conductor patterns on the smoother surface were piled up in sequence. The resultant stacks were pressed at a temperature of 50° C. and a pressure of 10 megapascals, and subsequently fired in a nitrogen atmosphere at 700° C.

Figure 8:
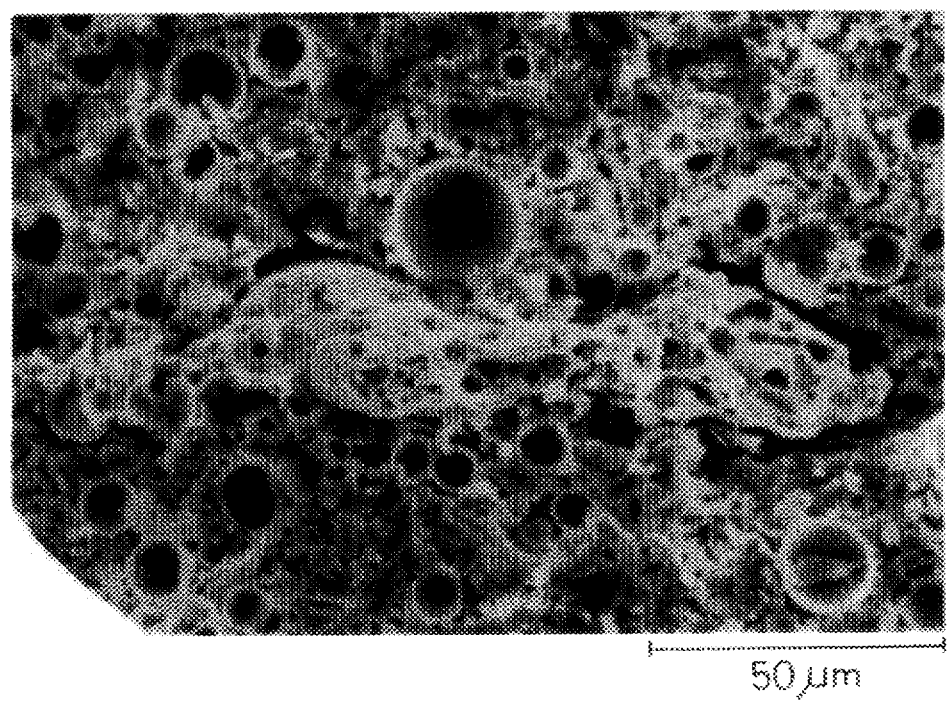
FIGS. 8 to 11 are photomicrographs of cross sections of various conductor patterns.
Figure 9:
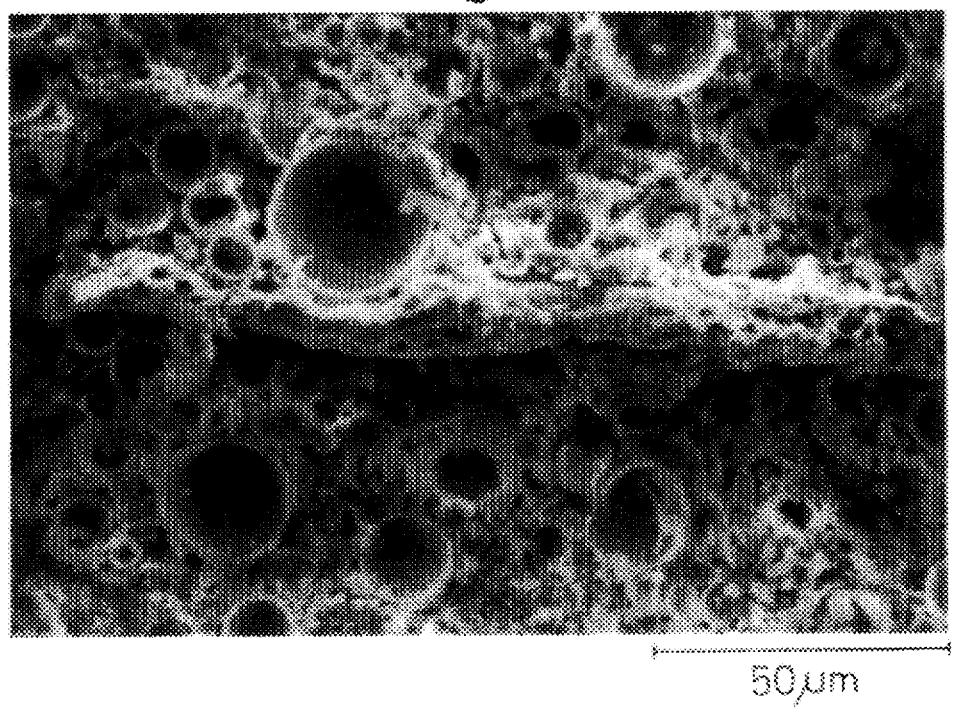
Figure 10:
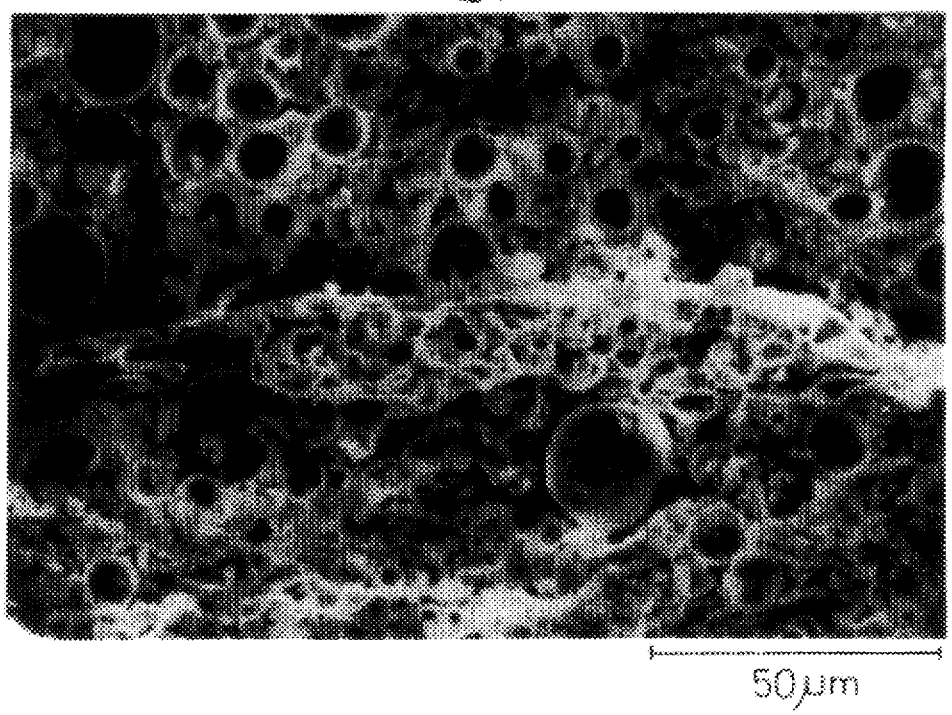
Figure 11:
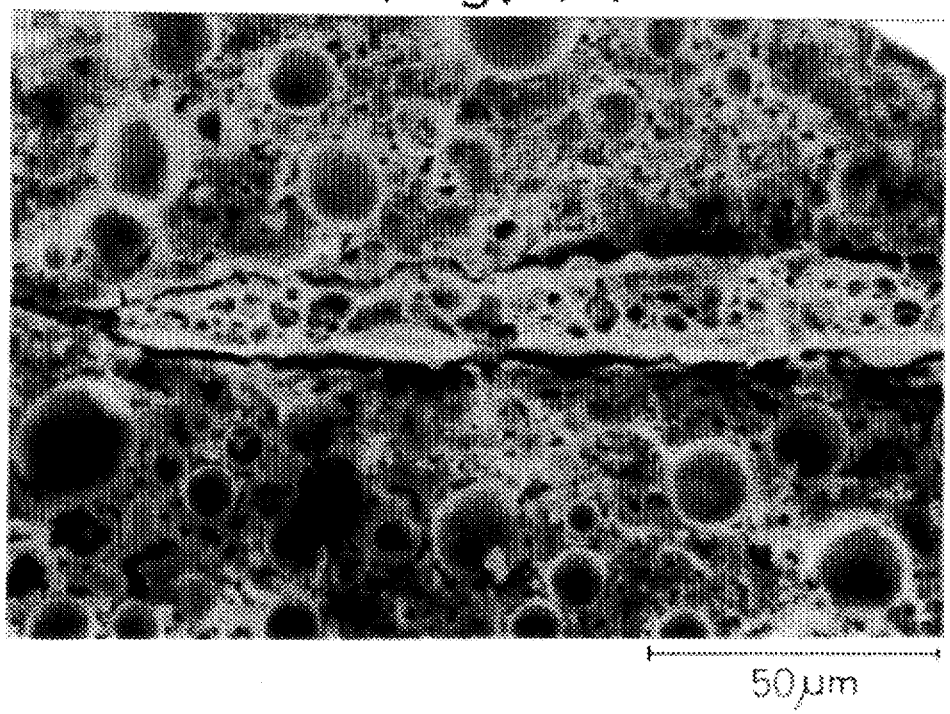

The fired stacks were cut for electron microscopy. FIGS. 8 to 11 show the obtained photomicrographs of four types of conductor patterns in the stacks. Among the electron photomicrographs, FIG. 8 shows a conductor pattern sandwiched between the rougher surfaces of the respective green sheets. FIG. 9 shows a conductor pattern sandwiched by the overlaying rougher surface and the underlying smoother surface of the green sheets. FIG. 10 is a photomicrograph of a conductor pattern sandwiched by the overlaying smoother surface and the underlying rougher surface of the green sheets. FIG. 11 is a photomicrograph of a conductor pattern sandwiched between the smoother surfaces of the respective green sheets.

As can be seen from these photomicrographs, the conductor pattern shown in FIG. 8 suffers from the most severe irregularity in cross-sectional profile, which is caused by a particle or particles of hollow powder projecting out of the surface of the green sheet in contact with the conductor pattern, and possibly in part by a particle or particles of hollow powder present near the green sheet surface in contact with the conductor pattern, and which will be responsible for grave disturbance of the waveforms of high frequency signals transmitted through the conductor pattern. In the patterns shown in FIGS. 9 and 10, the irregularity in cross-sectional profile thereof is improved compared with the pattern in FIG. 8. However, these patterns still suffer from significant deformation of cross-sectional profile at the side thereof in contact with the rougher surface of one of the green sheets sandwiching the pattern. In contrast, the conductor pattern shown in FIG. 11 is completely free from deformation of cross-sectional profile due to the particles of hollow silica contained in the green sheets in contact with the conductor pattern.

Thus, according to the invention, signal transmitting conductor patterns in the multi-layered ceramic circuit boards are necessarily in contact with the smoother surfaces of the respective green sheets containing hollow powder and sandwiching the patterns. Consequently, the invention favorably provides multi-layered ceramic circuit boards in which a layer or layers of fine conductor patterns for signal transmission are interposed between component ceramic layers containing hollow inorganic powder, the conductor patterns being free from an irregular cross-sectional profile due to the hollow powder particles in the component ceramic layers. Such multi-layered ceramic circuit boards are particularly useful for high speed transmission of digital signals of particularly high frequency.

We claim:

1. A method of producing a multi-layered ceramic circuit board having a reduced dielectric constant, which comprises laminated, component ceramic layers comprising one or more hollow inorganic powders and one or more non-hollow inorganic powders, there being three or more conductor pattern layers each being interposed between two adjacent component ceramic layers, at least two of said conductor pattern layers being power-supply/grounding layers in the circuit board, and the remaining conductor pattern layer or layers being a signal transmitting layer or layers positioned between the power-supply/grounding layers, the method comprising the following steps:

(a) mixing one or more hollow inorganic powders, one or more non-hollow inorganic powders, an organic binder and a solvent to thereby prepare a slurry;

(b) spreading the slurry on a plane substrate;

(c) drying the spread slurry to form a primary green sheet;

(d) making a plurality of green sheets having a predetermined size from the primary green sheet;

(e) forming via-holes in the individual green sheets for interlayer connection;

(f) printing a conductor paste on a surface of each green sheet having a predetermined size to thereby form predetermined conductor patterns;

(g) laminating the printed green sheets, and placing a further green sheet having no printed conductor pattern on the uppermost printed green sheet, to thereby form a stack of the green sheets; and (h) firing the stack;

wherein the stack of the green sheets is formed in such a manner that the conductor patterns for signal transmission are in contact only with the smoother surface of each green sheet containing the hollow powder, the smoother surface having been in contact with a surface of the substrate during the formation of the primary green sheet from which the green sheets for the stack are made, and wherein the stack of the green sheets is made by forming the conductor patterns of the power-supply/grounding layers on the rougher surfaces of respective green sheets from which hollow powder particles project, forming the conductor patterns of the signal transmitting layer or layers on the smoother surfaces of respective green sheets in which surface no hollow powder particles are present, and laminating the green sheets in such a manner that each green sheet bearing the signal transmitting conductor patterns is interposed between the green sheets bearing the power-supply/grounding patterns.

2. The method of claim 1, wherein hollow silica powder and/or hollow alumina powder is used as the hollow inorganic powder.

3. The method of claim 2, wherein one or more powders selected from the group consisting of silicate glass powder, borosilicate glass powder, quartz glass powder, and alumina powder are used as the non-hollow inorganic powder.

4. The method of claim 1, further comprising providing one or more ceramic layers containing no hollow powder to cover at least one surface of the circuit board.

5. The method of claim 4, further comprising forming a thin conductor film pattern on the top layer containing no hollow powder.

6. A method of producing a multi-layered ceramic circuit board having a reduced dielectric constant, which comprises laminated, component ceramic layers comprising one or more hollow inorganic powders and one or more non-hollow inorganic powders, there being three or more conductor pattern layers each being interposed between two adjacent component ceramic layers, at least two of said conductor pattern layers being power-supply/grounding layers in the circuit board, and the remaining conductor pattern layer or layers being a signal transmitting layer or layers positioned between the power-supply/grounding layers, the method comprising the following steps:

(a) mixing one or more hollow inorganic powders, one or more non-hollow inorganic powders, an organic binder and a solvent to thereby prepare a slurry;

(b) spreading the slurry on a plane substrate;

(c) drying the spread slurry to form a primary green sheet;

(d) making a plurality of green sheets having a predetermined size from the primary green sheet;

(e) forming via-holes in the individual green sheets for interlayer connection;

(f) printing a conductor paste on a surface of each green sheet having a predetermined size to thereby form predetermined conductor patterns;

(g) laminating the printed green sheets, and placing a further green sheet having no printed conductor pattern on the uppermost printed green sheet, to thereby form a stack of the green sheets; and (h) firing the stack;

wherein the stack of the green sheets is formed in such a manner that the conductor patterns for signal transmission are in contact only with the smoother surface of each green sheet containing the hollow powder, the smoother surface having been in contact with a surface of the substrate during the formation of the primary green sheet from which the green sheets for the stack are made, said method further comprising combining two green sheets formed in step (d) in such a manner that the rougher surfaces of the individual green sheets are in contact with each other, and pressing and bonding the combined green sheets to each other, to thereby produce an integrated green sheet having smoother surfaces on both sides thereof, for use as the green sheets in the subsequent steps.

7. The method of claim 6, wherein the lowermost conductor pattern layer is formed on the smoother surface of a non-integrated green sheet as formed in step (d).

8. The method of claim 6, wherein hollow silica powder and/or hollow alumina powder is used as the hollow inorganic powder.

9. The method of claim 8, wherein one or more powders selected from the group consisting of silicate glass powder, borosilicate glass powder, quartz glass powder, and alumina powder are used as the non-hollow inorganic powder.

10. The method of claim 6, further comprising providing one or more ceramic layers containing no hollow powder to cover at least one surface of the circuit board.

11. The method of claim 10, further comprising forming a thin conductor film pattern on the top layer containing no hollow powder.

12. A method of producing a multi-layered ceramic circuit board having a reduced dielectric constant, which comprises laminated, component ceramic layers comprising one or more hollow inorganic powders and one or more non-hollow inorganic powders, there being three or more conductor pattern layers each being interposed between two adjacent component ceramic layers, at least two of said conductor pattern layers being power-supply/grounding layers in the circuit board, and the remaining conductor pattern layer or layers being a signal transmitting layer or layers positioned between the power-supply/grounding layers, the method comprising the following steps:

(a) mixing one or more hollow inorganic powders, one or more non-hollow inorganic powders, an organic binder and a solvent to thereby prepare a slurry;

(b) spreading the slurry on a plane substrate;

(c) drying the spread slurry to form a primary green sheet;

(d) making a plurality of green sheets having a predetermined size from the primary green sheet;

(e) forming via-holes in the individual green sheets for interlayer connection;

(f) printing a conductor paste on a surface of each green sheet having a predetermined size to thereby form predetermined conductor patterns;

(g) laminating the printed green sheets, and placing a further green sheet having no printed conductor pattern on the uppermost printed green sheet, to thereby form a stack of the green sheets; and (h) firing the stack;

wherein the stack of the green sheets is formed in such a manner that the conductor patterns for signal transmission are in contact only with the smoother surface of each green sheet containing the hollow powder, the smoother surface having been in contact with a surface of the substrate during the formation of the primary green sheet from which the green sheets for the stack are made, and wherein the stack of the green sheets is made by forming all conductor patterns in a multi-layered ceramic circuit board on the smoother surfaces of the respective green sheets, and laminating the green sheets in sequence, while inserting an additional, hollow inorganic powder-containing green sheet between each two sequentially laminated green sheets in such a manner that the smoother surface of each additional green sheet comes into contact with the signal transmitting patterns on the respective laminated green sheets, each inserted, additional green sheet being provided with via-holes aligned with the corresponding via-holes in the green sheets bearing the signal transmitting patterns with which the additional green sheet comes into contact.

13. The method of claim 12, wherein hollow silica powder and/or hollow alumina powder is used as the hollow inorganic powder.

14. The method of claim 13, wherein one or more powders selected from the group consisting of silicate glass powder, borosilicate glass powder, quartz glass powder, and alumina powder are used as the non-hollow inorganic powder.

15. The method of claim 12, further comprising providing one or more ceramic layers containing no hollow powder to cover at least one surface of the circuit board.

16. The method of claim 15, further comprising forming a thin conductor film pattern on the top layer containing no hollow powder.

* * * * *